PULSED SUBSTRATE TRANSISTOR INVERTER

Filed Dec. 10, 1968 2 Sheets-Sheet 1

INVENTORS:
A.O. CHRISTENSEN
C. B. VOGEL

PULSED SUBSTRATE TRANSISTOR INVERTER

Filed Dec. 10, 1968 2 Sheets-Sheet 2

INVENTORS:
A. O. CHRISTENSEN
C. B. VOGEL 3,502,909

PULSED SUBSTRATE TRANSISTOR INVERTER

Alton O. Christensen and Charles B. Vogel, Houston, Tex., assignors to Shell Oil Company, New York, N.Y., a corporation of Delaware Filed Dec. 10, 1968, Ser. No. 782,561

Int. Cl. H03k *17/00*

U.S. Cl. 307—251 7 Claims

ABSTRACT OF THE DISCLOSURE

An inverter circuit for field-effect transistors consisting of at least one transistor with a capacitor connected between the source electrode and ground and a source of negative clock pulses tied to the drain electrode and substrate electrode.

BACKGROUND OF THE INVENTION

The invention, in general, relates to transistor inverting circuits and more particularly to a field-effect transistor inverting circuit with substantially improved properties.

Field-effect transistors can conveniently be broken down into the junction type and the insulated gate type (IGFET). Of the IGFET type, the metal-oxide-silicon field-effect transistor (MOS FET) is presently the most popular. These devices have the features of a solid-state voltage amplifier with very high input impedance and a transfer characteristic similar to that of a vacuum tube pentode. In many ways these devices combine the most attractive features of the transistor and the vacuum tube. In addition to small size, reduced power, and mechanical ruggedness, the MOS FET's offer nearly complete isolation of input from output. In the field of integrated circuits, MOS FET's may be used to create substantially more complex functions on the same amount of silicon surface.

Although the invention is generally applicable to all field-effect transistors, it will be explained in terms of the MOS FET and, more particularly, in terms of the P channel enhancement mode of operation.

To understand how MOS FET circuits operate, it is valuable to understand the structure and operation of the actual MOS FET devices. FIGURE 1 shows a single MOS FET transistor in cross section. It consists of a block of $N^-$ silicon, called the substrate, into which $P^+$ impurities, such as boron, are diffused in two parallel stripes. The $P^+$ parallel stripes are known as the source and drain. The surface of the silicon is covered by a protective layer of silicon dioxide, which is naturally formed during the process by which the devices are made. Tiny windows are etched through the silicon to the source and drain region and metallic contacts are deposited thereon. The gate is a metallic conductor deposited over the oxide on that region between the source and drain. It makes no electrical or physical contact with the silicon substrate but interacts therewith through a field-effect. If the gate, source, and substrate are grounded and a negative voltage is supplied to the drain, no current will flow between source and drain, since the drain-to-substrate P-N junction is reverse biased. As a result, the source and drain are isolated from each other. However, if a negative voltage is applied to the gate, electrons are repelled from the surface region of the silicon immediately under the gate and holes are attracted thereto. As the gate-source voltage becomes more negative, the surface region finally changes from N type and becomes a P type material. This is known as inversion, and the newly created P region (shown as a dotted line in FIGURE 1) is called a channel. The P-channel provides a path for conduction of the charge carriers between the source and drain. With a negative voltage on the drain and the source at ground potential, or vice versa, a current will flow through the P-channel. The resistance to current flow presented by the P-channel is called the on-resistance of the transistor and is small compared to the off-resistance (no signal on the gate). For example, the off-resistance may be several million ohms whereas the on-resistance may typically be between 500 and 5,000 ohms.

Before the surface can be inverted to form a channel, the gate voltage must reach a certain critical level called the threshold voltage, $V_t$, which physically is the voltage necessary to neutralize the surface charges. Typical processing can achieve a $V_t$ of from three to five volts. As the gate voltage becomes more negative than $V_t$, the channel depth, and hence the conduction path, increases. By varying the gate voltage, it is possible to modulate the P-channel and thereby vary the on-resistance. Thus since current flow through the P-channel is controlled by the on-resistance, the gate voltage can be used to vary the current.

In determining the usefulness of a particular MOS FET circuit, there are several circuit properties or parameters that must be considered together. For example, it is recognized that the circuits should take up as little space on the semi-conductor chip as possible, so that the cost per circuit is minimized. Power dissipation should be small to avoid cooling problems. And it is nearly always desirable that the circuits be able to operate as fast as is possible.

As would be expected, circuit designers are always looking for ways of upgrading these parameters. Yet, after years of effort, field-effect transistor circuits still remain relatively slow when compared with the bipolar transistor. Being slow, FET circuits are not competitive with traditional bipolar transistor circuits in many applications, such as logic and memory cell components, such as inverters. This is true even though many other FET circuit parameters such as power dissipation, size and input-output isolation are superior to those of bipolar transistor circuits. It is, therefore, a primary object of this invention to provide a substantially faster FET circuit.

A further object of the invention is to provide an inverter circuit that does not require a DC bias voltage.

A further object of the invention is to provide an inverter circuit requiring less power than was heretofore possible.

A further object is to provide an inverter circuit that takes up a smaller area on the semiconductor chip than was heretofore possible by the use of minimum-area transistors.

A further object of this invention is to provide an inverter circuit requiring only one field-effect transistor.

Finally, it is an object of the invention to provide a very simple, low cost, and fast logic building block from which other more sophisticated logic circuits, such as AND, OR, NOR, flip-flops, and the like, can be fabricated.

For a better understanding of how the present invention achieves the above objects, it is worthwhile to briefly describe the prior art. FIGURE 2 illustrates the relationship between the actual physical embodiment of a MOS FET as shown in FIGURE 1 and the conventional circuit diagram symbol. The dotted line represents the silicon substrate whereas the solid lines are the circuit diagram symbol. In all known prior art applications of the field effect transistor, the substrate of the device is grounded. In fact, the substrate terminal is rarely indicated in circuit diagrams. With the substrate grounded, the field effect transistor more closely resembles other basic 3-terminal devices familiar to designers such as the conventional bipolar transistor and triods. But, by considering the field effect transistor as having only the source drain and gate electrodes with which to work and over-looking the possibilities of the substrate electrode, prior circuit designers left undiscovered some very remarkable circuits as will now be described.

SUMMARY OF THE INVENTION

The truly basic and revolutionary contribution of the invention was the discovery that by taking the substrate off of ground potential and attaching it to the circuit clock, remarkable improvements in speed could be achieved as well as a reduction in circuit size. As pointed out above, it had always been the practice in the past to ground the substrate. In the more than twenty years since field-effect transistors were discovered, there is no known instance of utilizing the substrate electrode affirmatively in the operation of a circuit.

The present invention can be practiced using either two transistors in a parallel configuration or a single transistor. In the case of the two transistors, the clock pulse is supplied to the substrate of both and the drain electrode of both plus the gate electrode or control electrode of one.

The data is applied to the control gate of the other transistor, while the output pulse appears at the interconnected drain electrodes. In both the single transistor and the parallel transistor configuration, a capacitor is coupled between the source and ground. In the single-device configuration, the invention is a transistor circuit that includes a transistor having a gate electrode, a substrate electrode and two additional electrodes. A capacitor is connected between one of the additional electrodes and ground. The other additional electrode and the substrate are connected to a source of clock pulses. The data input to this circuit is through the gate electrode and the output is taken at the common point between the capacitor and the additional electrode.

PREFERRED EMBODIMENT OF THE INVENTION

Figure 1:
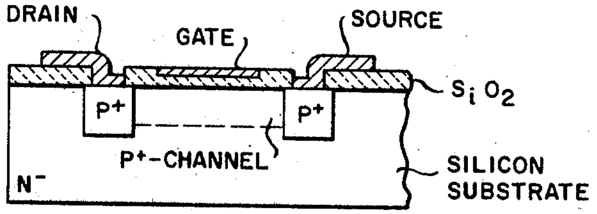
FIG. 1 PRIOR ART
FIGURE 1 is a diagrammatic illustration of a MOS FET in cross section.
Figure 2:
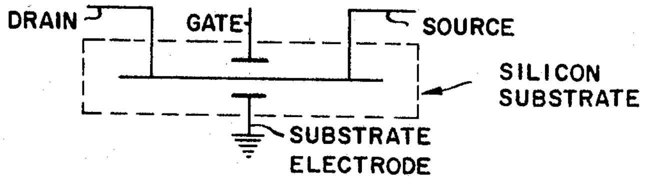
FIGURE 2 is an illustration of a prior art device.
Figure 3:
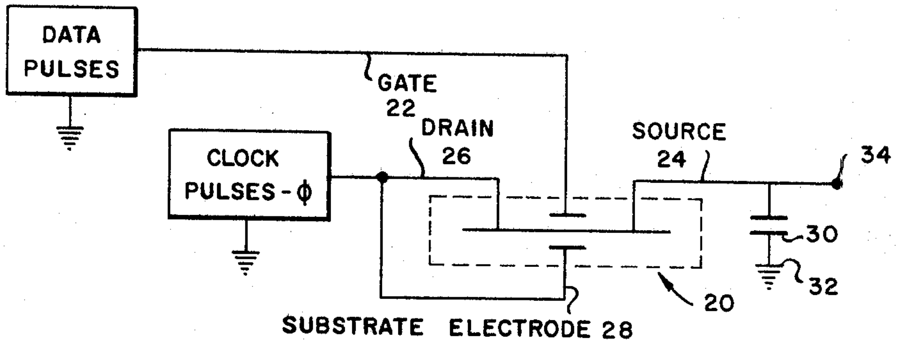
FIGURE 3 is a schematic diagram of a circuit made in accordance with the present invention.

Referring now to FIGURE 3, there is shown an insulated gate field-effect transistor (IGFET) 20 having a gate or control electrode 22, a substrate electrode 28, and two additional electrodes 24 and 26. By convention, the additional electrode closest to ground, in this case electrode 24, is referred to as the source electrode and the other electrode 26 as the drain electrode. Terminal 26 is connected to a low-impedance clock, $\phi$, generally having an internal impedance, $R_\phi$, of 50 ohms or less, and capable of generating narrow-width, fast rise-time pulses. For example, pulses in the range of 5 to 50 nanoseconds are desirable. The pulse width and the cycle time are, of course, a matter of some choice, but generally the narrower the pulse width, the faster the cycle time and the faster the general operation of the circuit.

A source of clock pulses is nearly always used in computers so that the thousands of component circuits can be operated together with the clock, to avoid complex timing problems. Thus the use of the clock in the present circuit is not an added complication.

A capacitor 30 is connected between the source electrode 24 and signal ground 32, with the circuit output 34 taken at the common point between source 24 and capacitor 30. Capacitor 30 is a fabricated capacitor intentionally designed into the circuit. It is not merely the parasitic capacitance associated with other circuit elements, although it may include such parasitics and any following stage capacitances as well.

Since only one transistor is used, the physical size of the circuit will be small. For integrated circuits, this is very important. A reduction in circuit size means that more circuits can be made on each chip which in turn means that the cost per circuit is reduced. Also a reduction in the number of functional elements increases circuit reliability, since the number of components which may fail is reduced. Furthermore, the invention avoids using any D.C. bias voltage which reduces power consumption and eliminates one input/output connection.

The invention will be described in terms of P-channel enhancement mode devices although the invention clearly contemplates the use of equivalent devices such as N-channel depletion mode devices. With P-channel enhancement mode devices, the clock pulses swing from ground level to a negative amplitude of the order of 4 to 5 times the threshold voltage of the device (threshold voltages are in the neighborhood of 2 to 5 volts). The data pulses also swing from ground to a negative amplitude of the order of 2 to 3 times the threshold voltage of the device. Ground level is defined as a logic "zero" and a negative voltage level is defined as a logic "one."

Figure 4:
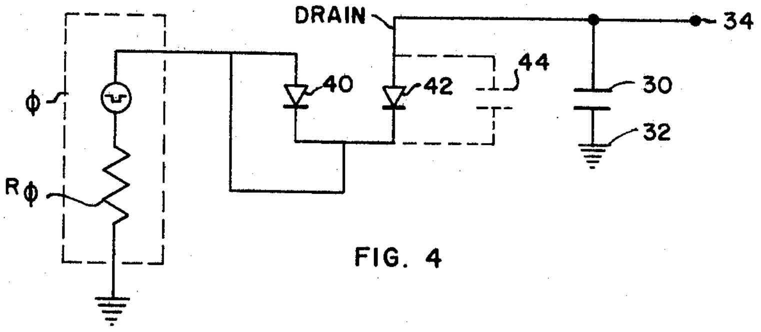
FIGURE 4 is an equivalent circuit diagram of the circuit of FIGURE 2 when the transistor is in the non-conducting mode.
Figure 5:
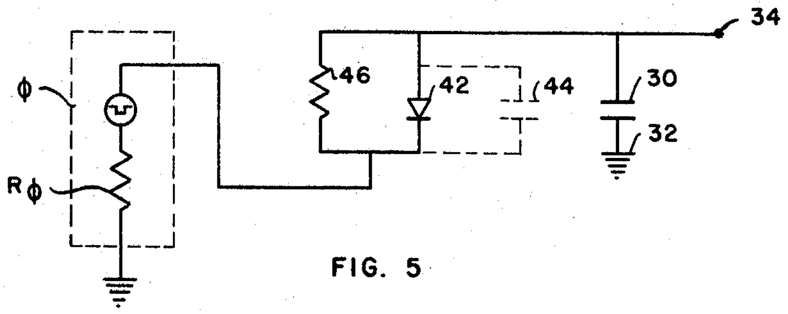
FIGURE 5 is an equivalent circuit diagram of the circuit of FIGURE 2 when the transistor is in the conducting mode.

To understand the operation of the circuit of FIGURE 3, it is helpful to break the circuit down into equivalents. Thus, FIGURE 4 is the equivalent circuit for the circuit of FIGURE 3 with a zero, or ground level, voltage input on gate electrode 22. FIGURE 5 is the equivlanet circuit for the circuit of FIGURE 3 when a negative pulse, or logic "one," is applied to gate electrode 22.

Referring now to FIGURE 4, diodes 40 and 42 are then P-N diodes inherent in the construction of IGFET 20. they exist between the P-material forming the source and drain and the N-substrate material into which the P-material is diffused. The leading edge of the clock pulse biases diode 42 into the conducting mode which enables capacitor 30 to be charged to substantially the clock pulse amplitude. Thus, the output of the circuit is also at the clock pulse amplitude. The charging of capacitor 30 through a diode is extremely fast since the resistance of a forward biased diode is only a few ohms and the time to charge the capacitor is related to the product of the capacitor and the resistance through which it is charged.

In the prior art circuits, any charging or discharging of capacitors had to be done through the on-resistance of the transistor which was generally one or two orders of magnitude greater than the on-resistance of a forward biased diode. Thus, it can be seen that a very substantial improvement in speed is achieved at this point.

Capacitor 44 is a parasitic capacitance associated with the P-N junctions of transistor 20 and will vary in value depending on the transistor used. In operation the clock voltage will divide between capacitor 44 and capacitor 30. Thus, it is desirable to have capacitance 30 large with respect to capacitance 44. As a nominal design criterion a ratio of 10:1 between the capacitances is acceptable, with a greater ratio being desirable. In practice, a high ratio is easy to achieve, since the junction capacitance 44 is generally very small.

The trailing edge of the clock pulse will turn off diode 42 and thereby isolate the negative clock pulse voltage on the output 34. To avoid any circuit malfunction due to leakage current discharge of capacitor 30, the repetition rate of the clock is chosen so as to replenish the charge before it is substantially diminished. Thus, a "zero" level input signal has produced a "one" level output signal.

When a negative pulse is applied to control electrode 22, FIGURE 5 represents the equivalent circuit for the circuit of FIGURE 3. Again, as in the case with a zero level data pulse, the leading edge of the clock pulse will bias diode 42 into the conducting mode so that capacitor 30 is again charged to substantially the clock pulse amplitude. Again, there may be some voltage division between capacitor 30 and capacitor 44.

When the trailing edge of the clock pulse turns off diode 42, there still remains a conductive path between capacitor 30 and the low impedance clock to ground through the on-resistance 46 of transistor 20. Transistor 20 remains on since, as will be explained later, the data pulse remains for sometime after the clock-pulse has returned to ground. Thus, so long as transistor 20 remains in the conducting mode, capacitor 30 will have a conducting path by which it can be discharged. The discharge path is through the on-resistance of the transistor and the impedance of the clock $R_\phi$ to the clock ground. Depending on the values of capacitance, resistance, and transistor on-time, it can be ensured that the voltage level on output 34 will be substantially signal ground. Thus, a logic "one" input signal supplied to control electrode 22 provides a logic "zero" output on terminal 34.

Figures 6, 7:
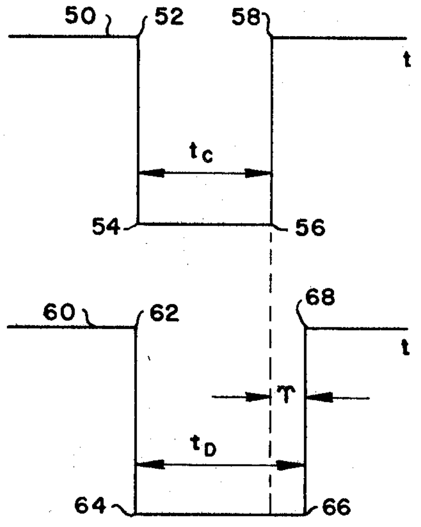
FIGURE 6 represents a typical clock pulse wave form.
FIGURE 7 illustrates a typical data signal.
Figure 8:
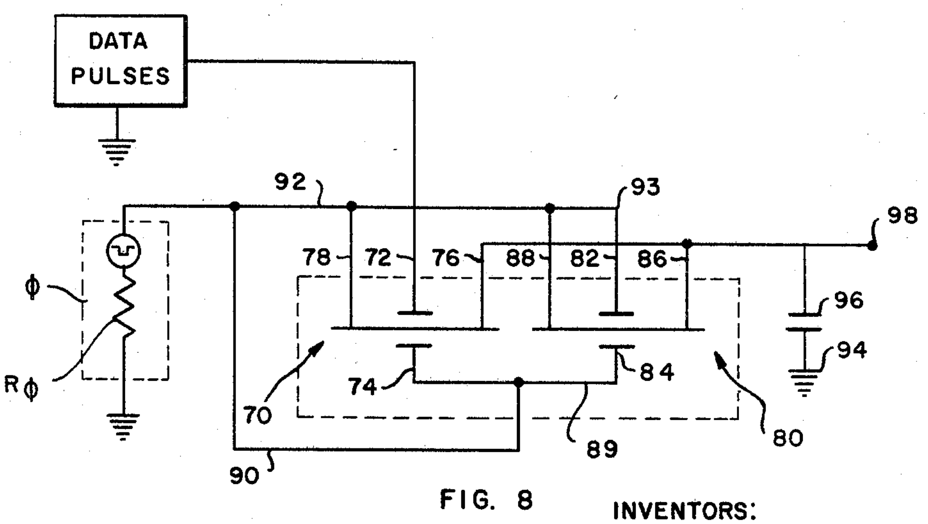
FIGURE 8 is a schematic diagram of a two-transistor embodiment of the invention.

To understand the timewise operation of the circuit, it is helpful to refer to FIGURES 6 and 7. FIGURE 6 represents an idealized graph of a clock signal 50. Signal 50 is at ground potential from time 50 to time 52, at which time it swings sharply negative to its maximum amplitude at 54. The clock signal then remains negative for some time $t_C$ at which time 56 it again returns abruptly to ground at 58. This operation is then repeated cyclically and thereby supplies a train of clock pulses to the circuit.

FIGURE 7 is constructed on the same time axis as FIGURE 6 and represents a typical data signal. Data signal 60 is at ground level until time 62 when it swings sharply negative to its full amplitude at 64. The data signal then remains negative for some period of time $t_D$ when it returns sharply to ground potential at 68. This operation is also repeated, not cyclically, but in accordance with the data being presented to the circuit. Data consists of either a pulse or lack thereof. Of course, the wave forms of FIGURES 6 and 7 are idealized, and in an actual circuit, rise and fall time would be finite.

Data pulse 60 must remain on for some time $\tau$ after the clock pulse has returned to ground to allow the capacitor 30 to be discharged when a logic "one" is on input 22. The leading edge of the data pulse need not necessarily coincide with the leading edge of the clock pulse, but it is important that the data pulse be on for some time $\tau$ after the clock pulse has returned to ground. The data pulse may take place entirely during the time that the clock signal is at ground; or it may partially overlap the clock pulse on either side; and $t_D$ may be of any length. Indeed, the only conditions under which the circuit will not operate are when the clock and data pulses occur together and the data pulse extends beyond the clock pulse by some time less than $\tau$. But to maximize the speed of operation of the circuit it has been found that the leading edge of the data pulse should occur between times 52 and 58 and the trailing edge should occur substantially $\tau$ seconds after time 58. Typically, $\tau$ will be on the order of several nanoseconds, but will vary with transistors. In any event, $\tau$ must be long enough to permit capacitor 30 to discharge when transistor 20 is conductive after the clock signal has returned to ground.

FIGURE 7 illustrates a two-transistor embodiment of the present invention. Transistor 70 has a gate electrode 72, a substrate electrode 74, and two additional electrodes 76 and 78. Transistor 80 has a gate electrode 82, a substrate electrode 84, and two additional electrodes 86 and 88. Since transistors 70 and 72 would typically be fabricated on the same substrate, their substrate is common, and is illustrated by line 89 interconnecting substrate electrodes 74 and 84. The substrate is connected to the clock $\phi$ via lead 90. Common electrodes 78 and 88 are connected to the clock via lead 92, while gate electrode 82 is connected to the clock via lead 93. Between common electrodes 76 and 86 and ground 94 there is connected a capacitor 96. The output 98 is taken at the node between capacitor 96 and common electrodes 76 and 86.

The circuit operates in substantially the same manner as the circuit illustrated in FIGURE 3. As the clock pulse swings negative to its peak amplitude, the diodes existing between electrodes 76, 78, 86, and 88 and the substrate are biased into the conducting mode which causes capacitor 96 to be charged to some negative potential near that of the peak pulse amplitude. As discussed earlier, the voltage divides up proportionally between the parasitic capacitances associated with the P-N junctions and capacitor 96.

When the clock pulse returns to ground, the diodes are reverse biased. If a logical zero is on data input terminal 72, capacitor 96 will retain its negative charge, since both gates 72 and 82 are at ground potential and transistors 70 and 80 are therefore nonconducting. The negative charge retained on capacitor 96 appears at output 98. Thus, a logical zero input causes a logical one output.

If a logical one, that is, a negative voltage, appears on data input 72 at the time the clock pulse returns to ground, transistor 70 will be maintained in the conductive mode and capacitor 96 will be discharged therethrough to the clock ground. Thus, output 98 will be at ground potential and a logical one input will have caused a logical zero output.

The timewise operation of the circuit is the same as that discussed above for the circuit of FIGURE 3.

We claim as our invention:

1. A transistor circuit comprising:
- a transistor having control electrode, a substrate electrode, and first and second additional electrodes;
- a capacitor having two electrodes;
- means for connecting said first additional electrode in series with one electrode of said capacitor;
- means for connecting the other electrode of said capacitor to ground;
- means connected to said first electrode of said transistor for supplying an output signal;
- means for selectively supplying a data signal to said control electrode;
- means for supplying a periodic clock pluse to the other of said additional electrodes of said transistor and to said substrate electrode of said transistor whereby the signal on said output means is the inverse of said data signal on said control electrode.

2. The circuit of claim 1 wherein said transistor is a field-effect transistor.

3. The circuit of claim 1 wherein said data signals are pulses synchronized with said clock pulses.

4. A MOS FET inverter circuit comprising:
- a first MOS FET having a gate electrode, a substrate electrode, a source, and a drain, and a threshold voltage;
- a second MOS FET having a gate electrode, a substrate electrode, a source, and a drain;
- means for interconnecting the drains of said first MOS FET and said second MOS FET;
- means for interconnecting the sources of said first MOS FET and said second MOS FET;
- a capacitor coupled between said interconnected drains and ground;
- output means, said means connected to the common node of said capacitor and said interconnected drains;
- means for supplying periodic clock pulses connected to said substrate electrodes, said interconnected sources, and said gate electrode of said second MOS FET, said clock pulses having a leading edge, a trailing edge and being of an amplitude at least 4 times greater than said threshold voltage of said MOS FET;

means for selectively supplying a data signal to said gate electrode of said first MOS FET, said data signal comprising a sequence of pulses having a leading edge, a trailing edge and an amplitude at least 3 times greater than said threshold voltage of said MOS FET; said data pulses being so timed with respect to said clock pulses that said trailing edges of said data pulses occurs subsequent in time to said trailing edges of said clock pulses by at least $\tau$.

5. The apparatus of claim 4, wherein:

said MOS FET is a minimum area device.

6. The circuit of claim 4, wherein:

said leading edge of said data pulse occurs at substantially the same time as the leading edge of said clock pulse; and said trailing edge of said data pulse occurs substantially $\tau$ seconds subsequent to said trailing edge of said clock pulse.

7. A transistor circuit comprising:

a transistor having a control electrode, a substrate electrode, and first and second additional electrodes;

a capacitor having two electrodes;

means for connecting said first additional electrode in series with one electrode of said capacitor;

means for connecting the other electrode of said capacitor to ground;

means connected to said first additional electrode of said transistor for supplying an output signal;

means for supplying a periodic clock pulse to the other of said additional electrodes of said transistor and to said substrate electrode of said tranistor; and means for selectively supplying a data signal to said control electrode, so that the data signal remains on the control electrode after the clock pulse has returned to ground whereby the signal on said output means is the inverse of said data signal on the control electrode.

References Cited

UNITED STATES PATENTS

| | | | |
|---|---|---|---|
| 3,289,010 | 11/1966 | Bacon et al. | 307—221 |
| 3,395,291 | 7/1968 | Bogert | 307—304 |
| 3,393,325 | 7/1968 | Borror et al. | 307—304 |

DONALD D. FORRER, Primary Examiner.

B. P. DAVIS, Assistant Examiner

U.S. Cl. X.R.

307—208, 214, 304; 330—38